United States Patent
Eisert et al.

(10) Patent No.: US 9,431,586 B2
(45) Date of Patent: Aug. 30, 2016

(54) CERAMIC CONVERSION ELEMENT, OPTOELECTRONIC SEMICONDUCTOR ELEMENT, AND METHOD FOR PRODUCING A CERAMIC CONVERSION ELEMENT

(71) Applicant: OSRAM Opto Semiconductors GmbH, Regensburg (DE)

(72) Inventors: Dominik Eisert, Regensburg (DE); Ion Stoll, Tegernheim (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/434,356

(22) PCT Filed: Oct. 8, 2013

(86) PCT No.: PCT/EP2013/070933
§ 371 (c)(1),
(2) Date: Apr. 8, 2015

(87) PCT Pub. No.: WO2014/056903
PCT Pub. Date: Apr. 17, 2014

(65) Prior Publication Data
US 2015/0270453 A1    Sep. 24, 2015

(30) Foreign Application Priority Data
Oct. 10, 2012 (DE) .................. 10 2012 109 650

(51) Int. Cl.
*H01L 21/26* (2006.01)
*H01L 21/42* (2006.01)
(Continued)

(52) U.S. Cl.
CPC ............ *H01L 33/504* (2013.01); *B32B 18/00* (2013.01); *C09K 11/7774* (2013.01);
(Continued)

(58) Field of Classification Search
CPC .................. H01L 23/49506; H01L 23/3731; H01L 23/53209; H01L 23/3735; H01L 33/504; H01L 33/502; H01L 21/268; H01L 21/471; H01L 21/4807; H01L 21/02129
USPC ................ 438/535, 378, 474, 91, 70, 73; 257/E21.006, E21.053, E21.134, 257/E21.189, E21.321, E21.347, E21.352, 257/79, 288, 431
See application file for complete search history.

(56) References Cited

U.S. PATENT DOCUMENTS 7,804,099 B2 * 9/2010 Beeson .................. H01L 33/42
257/89
8,039,850 B2 10/2011 Lee et al.
(Continued)

FOREIGN PATENT DOCUMENTS

DE       10065381 B4    8/2010
DE    102011010118 A1    8/2012
(Continued)

*Primary Examiner* — David Nhu
(74) *Attorney, Agent, or Firm* — Slater Matsil, LLP (57) ABSTRACT

A ceramic conversion element includes a first ceramic layer having a first luminescent material, which transforms electromagnetic radiation of a first wavelength range into electromagnetic radiation of a second wavelength range. A second ceramic layer includes a second luminescent material, which transforms electromagnetic radiation of the first wavelength range into electromagnetic radiation of a third wavelength range. The first luminescent material and the second luminescent material are based on at least one inorganic compound containing oxygen and are different from one another. An optoelectronic component with a ceramic conversion element and a method for producing a ceramic conversion element are also specified.

15 Claims, 4 Drawing Sheets (51) Int. Cl.
  *H01L 33/50* (2010.01)
  *C09K 11/77* (2006.01)
  *B32B 18/00* (2006.01)
  *G02F 1/355* (2006.01)

(52) U.S. Cl.
  CPC ............ *G02F 1/355* (2013.01); *H01L 33/502* (2013.01); *C04B 2237/343* (2013.01); *C04B 2237/704* (2013.01); *H01L 2924/0002* (2013.01); *H01L 2933/0041* (2013.01)

(56) References Cited

U.S. PATENT DOCUMENTS

| | | | | |
|---|---|---|---|---|
| 8,106,579 | B2 * | 1/2012 | Otsuka | C09K 11/7734 257/98 |
| 8,552,448 | B2 | 10/2013 | Ichikawa | |
| 8,643,038 | B2 * | 2/2014 | Collins | C09K 11/0883 257/98 |
| 8,785,951 | B2 * | 7/2014 | Wirth | H01L 33/483 257/98 |
| 9,076,933 | B2 * | 7/2015 | Liepold | H01L 33/504 |
| 2005/0269582 | A1 | 12/2005 | Mueller et al. | |
| 2007/0267646 | A1 | 11/2007 | Wierer, Jr. et al. | |
| 2008/0129190 | A1 | 6/2008 | Otsuka | |
| 2008/0187746 | A1 | 8/2008 | De Graaf et al. | |
| 2009/0114929 | A1 | 5/2009 | Lee et al. | |
| 2011/0147778 | A1 | 6/2011 | Ichikawa | |
| 2011/0220929 | A1 | 9/2011 | Collins et al. | |
| 2011/0227477 | A1 | 9/2011 | Zhang et al. | |
| 2012/0098017 | A1 | 4/2012 | Komatsu et al. | |
| 2013/0320384 | A1 | 12/2013 | Liepold et al. | |

FOREIGN PATENT DOCUMENTS

| | | |
|---|---|---|
| DE | 102011113962 A1 | 3/2013 |
| DE | 102011116229 A1 | 4/2013 |
| DE | 102012104274 A1 | 11/2013 |
| JP | 2001313417 A | 11/2001 |
| JP | 2004161871 A | 6/2004 |
| JP | 2006253336 A | 9/2006 |
| JP | 2009117825 A | 5/2009 |
| JP | 2011129661 A | 6/2011 |
| WO | 2010131402 A1 | 11/2010 |
| WO | 2011112494 A1 | 9/2011 |
| WO | 2012012354 A2 | 1/2012 |

* cited by examiner

FIG 10

CERAMIC CONVERSION ELEMENT, OPTOELECTRONIC SEMICONDUCTOR ELEMENT, AND METHOD FOR PRODUCING A CERAMIC CONVERSION ELEMENT

This patent application is a national phase filing under section 371 of PCT/EP2013/070933, filed Oct. 8, 2013, which claims the priority of German patent application 10 2012 109 650.3, filed Oct. 10, 2012, each of which is incorporated herein by reference in its entirety.

TECHNICAL FIELD

A ceramic conversion element, an optoelectronic semiconductor component having a ceramic conversion element, and a method for producing a ceramic conversion element are specified.

BACKGROUND

Ceramic conversion elements are described, for example, in German patent publications DE 10 2011 010 118, DE 10 2011 113 962, and DE 10 2011 116 229. German patent publication DE 100 65 381 describes, for example, a layered conversion element based on resin.

SUMMARY

Embodiments of the invention specify a ceramic conversion element having two different phosphors, which can be manufactured in a simplified manner. Furthermore, an optoelectronic semiconductor component having a ceramic conversion element and a method for producing such a ceramic conversion element are specified.

A ceramic conversion element comprises in particular a first ceramic layer, which has a first phosphor, which converts electromagnetic radiation of a first wavelength range into electromagnetic radiation of a second wavelength range. Furthermore, the ceramic conversion element comprises a second ceramic layer, which has a second phosphor, which converts electromagnetic radiation of a first wavelength range into electromagnetic radiation of a third wavelength range. The first and the second phosphors are different from one another in this case and are each based on at least one oxygen-containing inorganic compound.

Furthermore, the first wavelength range, the second wavelength range, and the third wavelength range are also implemented differently from one another, wherein it is possible that the wavelength ranges can overlap with one another.

The first ceramic layer is particularly preferably completely formed from a ceramic. The second ceramic layer is also particularly preferably completely formed from a ceramic.

The entire ceramic conversion element is particularly preferably completely formed from ceramic materials. Furthermore, the present ceramic conversion element is advantageously preferably a monolithic conversion element, i.e., the ceramic layers of the conversion element are bonded to one another in an integrally joined and mechanically stable manner without a joining layer. This offers the advantage of simplified handling, for example, in relation to the use of individual conversion elements each having different phosphors.

A main extension plane of the first ceramic layer and a main extension plane of the second ceramic layer are particularly preferably arranged in parallel to a main surface of the ceramic conversion element. In other words, the first ceramic layer and the second ceramic layer form a layer sequence, in which a stack direction is perpendicular to a main surface of the ceramic conversion element.

According to one embodiment of the ceramic conversion element, the first ceramic layer and the second ceramic layer implement a common interface. In other words, the first ceramic layer and the second ceramic layer can be arranged in direct contact with one another.

The first phosphor and the second phosphor are particularly preferably oxygen-containing garnet phosphors. For example, the first phosphor and the second phosphor originate from the phosphor system $Ln_3(Al_5O_{12}):Ce^{3+}$, wherein Ln stands for at least one of the following elements: lutetium, yttrium, scandium, gadolinium, terbium.

The first phosphor is particularly preferably selected from the following group: $(Gd,Y)_3Al_5O_{12}:Ce^{3+}$, $Tb_3Al_5O_{12}:Ce^{3+}$ and the second phosphor is selected from the following group: $Lu_3Al_5O_{12}:Ce^{3+}$, $Sc_3Al_5O_{12}:Ce^{3+}$.

The first ceramic layer preferably has a thickness between 50 µm inclusive and 300 µm inclusive. The first ceramic layer particularly preferably has a thickness between 80 µm inclusive and 150 µm inclusive.

The second ceramic layer particularly preferably has a thickness between 30 µm inclusive and 100 µm inclusive.

The overall ceramic conversion element preferably has a thickness between 80 µm inclusive and 250 µm inclusive.

According to one embodiment of the ceramic conversion element, a third ceramic layer is arranged between the first ceramic layer and the second ceramic layer, this third ceramic layer having a third phosphor, which converts electromagnetic radiation of the first wavelength range into electromagnetic radiation of a fourth wavelength range. In this case, the third phosphor is particularly preferably based on at least one oxygen-containing inorganic compound. The fourth wavelength range is furthermore particularly preferably different from the first, the second, and the third wavelength ranges, wherein it is possible that the fourth wavelength range overlaps with one of the other wavelength ranges.

The first ceramic layer is particularly preferably free of the second phosphor and free of the third phosphor. The second ceramic layer is also particularly preferably free of the first phosphor and free of the third phosphor. The third ceramic layer is also preferably free of the first phosphor and free of the second phosphor. However, it is possible in this case that contaminants of the ceramic layers having the phosphors can be present in the respective other layers, for example, because of tolerances during the production process. In other words, the various phosphors of the conversion element are particularly preferably arranged spatially separated from one another in various layers, insofar as this is technically feasible. In this manner, reabsorption of already converted radiation by other phosphors can advantageously be at least reduced.

The first wavelength range particularly preferably comprises blue light or is formed from blue light. The second wavelength range particularly preferably comprises yellow and/or red light or is formed from yellow and/or red light. The third wavelength range particularly preferably comprises green light or is formed from green light. Such a conversion element is typically suitable for the purpose, together with a light source which emits blue light, of emitting mixed-color radiation having components of blue, yellow, or yellow-red and green radiation. Mixed-color radiation, which comprises components of blue light from the first wavelength range, yellow or yellow-red light from the second wavelength range, and green light from the third wavelength range, generally advantageously has a comparatively broad spectrum, which is suitable in particular for use as a flash light in a camera.

If the ceramic conversion element has a third ceramic layer, the first wavelength range thus preferably comprises blue light or is formed from blue light. The second wavelength range particularly preferably comprises yellow-red light or is formed from yellow-red light. The third wavelength range particularly preferably comprises green light or is formed from green light. The fourth wavelength range particularly preferably comprises yellow light or is formed from yellow light.

The third phosphor is preferably again selected from the same phosphor system as the first phosphor and the second phosphor. The third phosphor is particularly preferably also selected from the phosphor system $Ln_3(Al_5O_{12}):Ce^{3+}$, wherein Ln stands for at least one of the following elements: lutetium, yttrium, scandium, gadolinium, terbium. For example, the third phosphor is $(Gd,Y)_3Al_5O_{12}:Ce^{3+}$.

The ceramic conversion element is particularly preferably provided for the purpose of being used in an optoelectronic semiconductor component, such as a light-emitting diode.

An optoelectronic semiconductor component comprises in particular a semiconductor body, which emits electromagnetic radiation of the first wavelength range from a radiation exit surface in operation. Furthermore, the optoelectronic semiconductor component comprises the ceramic conversion element, which converts electromagnetic radiation from the first wavelength range at least partially into radiation from the second wavelength range and the third wavelength range, so that the optoelectronic semiconductor component emits electromagnetic radiation of the first wavelength range, the second wavelength range, and the third wavelength range.

For this purpose, the ceramic conversion element is particularly preferably arranged in the beam path of the semiconductor body. For example, the ceramic conversion element can be arranged in direct contact with the radiation exit surface of the semiconductor body. In this manner, particularly good cooling of the conversion element in operation of the semiconductor component is possible in particular. The ceramic conversion element can be glued onto the radiation exit surface, for example, using a silicone.

The ceramic conversion element is particularly preferably implemented such that it only partially converts the electromagnetic radiation of the semiconductor body into radiation from the second wavelength range and radiation from the third wavelength range, while a specific part of the electromagnetic radiation of the first wavelength range, which is emitted from the semiconductor body, passes through the ceramic conversion element unconverted. In this manner, the optoelectronic semiconductor component can emit mixed-color radiation, which comprises radiation of the first wavelength range, the second wavelength range, and the third wavelength range or consists of radiation of the first wavelength range, the second wavelength range, and the third wavelength range.

The mixed-color radiation particularly preferably has a colorimetric locus in the white, in particular in the neutral white range of the CIE chromaticity diagram.

The ceramic conversion element is particularly preferably arranged such that the ceramic layer faces toward the radiation exit surface of the semiconductor body, the phosphor of which converts the radiation of the first wavelength range into radiation having the greatest wavelengths. In other words, the ceramic layer having the phosphor, which converts the light of the first wavelength range into the longest wave light, is arranged so that it faces toward the semiconductor body and the light of the semiconductor body passes through this ceramic layer first. In this manner, reabsorption of already converted light by one of the other phosphors can be at least reduced.

If the ceramic conversion element comprises more than two ceramic layers having different phosphors, the layers are thus particularly preferably arranged such that the wavelength ranges in which the ceramic layer converts the radiation of the first wavelength range in each case contain smaller wavelengths with increasing distance from the semiconductor body.

A method for producing the ceramic conversion element particularly preferably comprises the following steps:
providing a first green film having a first phosphor, which is capable of converting electromagnetic radiation of a first wavelength range into electromagnetic radiation of a second wavelength range,
providing a second green film having a second phosphor, which is capable of converting electromagnetic radiation of a first wavelength range into electromagnetic radiation of a third wavelength range,
laminating the first green film with the second green film, and
sintering the layer composite having the first green film and the second green film, so that a ceramic conversion element results, as was already described.

The sintering of the layer composite is particularly preferably performed in a single sintering step. In this way, the production of the ceramic conversion element is simplified.

The respective green films can in turn be constructed in this case from multiple green films, which are laminated with one another. In this manner, it is possible to create thicker ceramic layers.

In general, to produce the green films, the respective phosphor in particle form is introduced into an organic matrix material, which is drawn into the green film. A method for producing a ceramic conversion element is described, for example, in German patent publication DE 10 2012 104 274, the content of the disclosure of which is hereby incorporated by reference.

The green film preferably has a thickness between 20 µm inclusive and 50 µm inclusive.

During the sintering process of the layer composite having the first green film and the second green film, the organic matrix material is particularly preferably completely incinerated.

The ceramic conversion element is based on the idea, inter alia, of selecting the first phosphor and the second phosphor from a common phosphor system, which is preferably oxygen-containing in the present case. In this manner, it is possible to sinter the two different phosphors jointly without causing degradation of the two phosphors because of the high temperatures required for sintering. This problem generally occurs in particular in the case of the combination of a nitridic phosphor—for example, for generating red light—with an oxide containing phosphor—for example, for generating yellow light. Such a combination of phosphors can be used, for example, for generating white light upon excitation using a semiconductor body which emits blue light.

Furthermore, it is advantageously possible by way of the use of different phosphors, which are all based on an oxygen-containing inorganic compound, however, to arrange the ceramic layers having these phosphors in direct contact with one another.

BRIEF DESCRIPTION OF THE DRAWINGS

Further advantageous embodiments and refinements of the invention result from the exemplary embodiments described hereafter in conjunction with the figures.

An exemplary embodiment of a method for producing a ceramic conversion element is described on the basis of FIGS. 5 to 9.

Identical, similar, or identically acting elements are provided with the same reference signs in the figures. The figures and the size ratios of the elements illustrated in the figures among one another are not to scale. Rather, individual elements, in particular layer thicknesses, can be illustrated exaggeratedly large for better illustration ability and/or for better comprehension.

DETAILED DESCRIPTION OF ILLUSTRATIVE EMBODIMENTS

Figure 1:
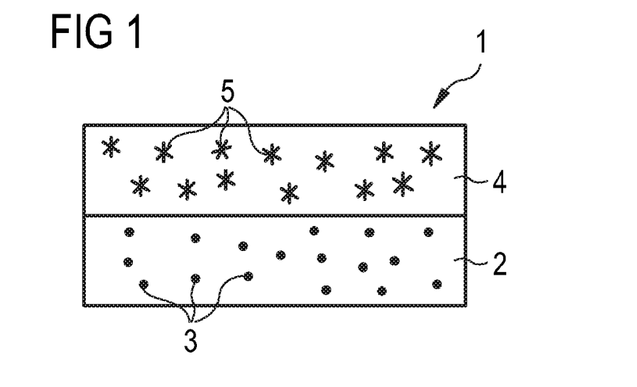
FIGS. 1 to 3 show a schematic sectional illustration of a ceramic conversion element according to one exemplary embodiment in each case.

The ceramic conversion element 1 according to the exemplary embodiment of FIG. 1 comprises a first ceramic layer 2 having a first phosphor 3. The first phosphor 3 is capable of converting blue light from a first wavelength range into yellow light. In other words, the second wavelength range in the exemplary embodiment according to FIG. 1 comprises yellow light. The first phosphor 3 is, for example, $Y_3Al_5O_{12}$:$Ce^{3+}$.

A second ceramic layer 4 is arranged in direct contact with the first ceramic layer 2. The second ceramic layer 4 has a second phosphor 5, which is capable of converting blue light from the first wavelength range into green light. The second phosphor 5 is, for example, $Lu_3Al_5O_{12}$:$Ce^{3+}$.

In the ceramic conversion element 1 according to the exemplary embodiment of FIG. 1, both the first ceramic layer 2 and also the second ceramic layer 4 are completely formed from one ceramic and are arranged in direct contact with one another, so that the first ceramic layer 2 and the second ceramic layer 4 implement a common interface.

The ceramic conversion element 1 according to FIG. 1 is implemented as monolithic, i.e., the first ceramic layer 2 and the second ceramic layer 4 are bonded to one another in a mechanically-stable, integrally-joined manner and without a separate joining layer, for example, by means of a sintering process. The ceramic conversion element 1 particularly preferably consists of the first ceramic layer 2 and the second ceramic layer 4.

The ceramic layers 2, 4 of the conversion element 1 comprise two different phosphors 3, 5, which are both based on an oxygen-containing inorganic compound, however, and are selected from a common phosphor system.

Figure 2:
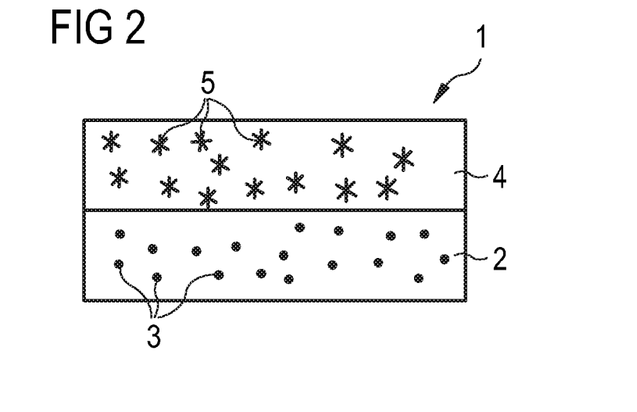

The ceramic conversion element 1 according to the exemplary embodiment of FIG. 2 also comprises two ceramic layers 2, 4 having two different phosphors 3, 5. In contrast to the ceramic conversion element 1 according to the exemplary embodiment of FIG. 1, however, the first ceramic layer 2 has a first phosphor 3, which is capable of converting blue light of the first wavelength range into red-yellow light. The first phosphor 3 is, for example, $Tb_3Al_5O_{12}$:$Ce^{3+}$. Otherwise, the ceramic conversion element 1 according to FIG. 2 is implemented precisely like the ceramic conversion element 1 according to FIG. 1.

Figure 3:
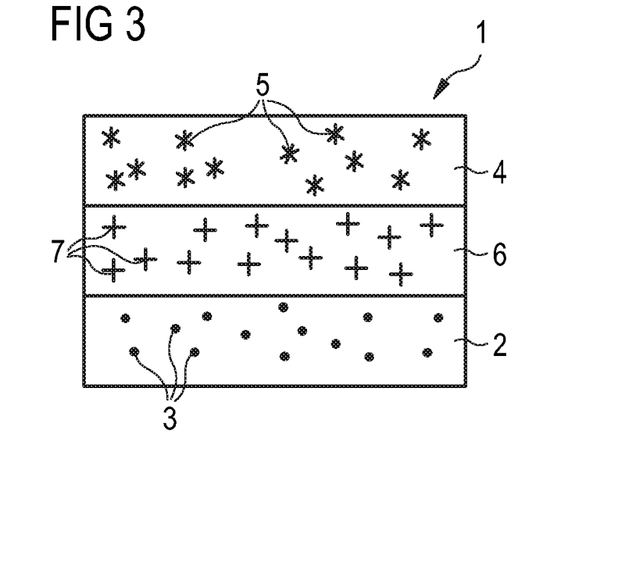

The ceramic conversion element 1 according to the exemplary embodiment of FIG. 3 has, in contrast to the ceramic conversion elements 1 according to FIGS. 1 and 2, three ceramic layers. The first ceramic layer 2 has the first phosphor 3, which is capable of converting blue light of the first wavelength range into yellow to red light. The first phosphor 3 is, for example, $Tb_3Al_5O_{12}$:$Ce^{3+}$.

The second ceramic layer 4 has the second phosphor 5, which is capable of converting blue light of the first wavelength range into green light of the second wavelength range. The second phosphor 5 is, for example, $Lu_3Al_5O_{12}$:$Ce^{3+}$.

A third ceramic layer 6 is arranged between the first ceramic layer 2 and the second ceramic layer 4. The third ceramic layer 6 has a third phosphor 7, which is capable of converting radiation of the first wavelength range into radiation from a third wavelength range. The third wavelength range comprises yellow light in the present exemplary embodiment. The third phosphor 7 is, for example, $Y_3Al_5O_{12}$:$Ce^{3+}$.

The three ceramic layers 2, 4, 6 are each arranged in direct contact with one another. The ceramic conversion element 1 particularly preferably consists of the three ceramic layers 2, 4, 6.

The ceramic conversion element 1 is provided for the purpose of being arranged such that radiation of the first wavelength range first passes through the first ceramic layer 2, then through the second ceramic layer 4, and then through the third ceramic layer 6. In this manner, the radiation of the first wavelength range is partially first converted into red-yellow light, then partially converted into yellow light, and finally partially converted into green light. In other words, the ceramic layers 2, 4, 6 are arranged such that the wavelength ranges in which the ceramic layers 2, 4, 6 each convert the radiation of the first wavelength range contain smaller wavelengths with increasing distance from the light source.

Figure 4:
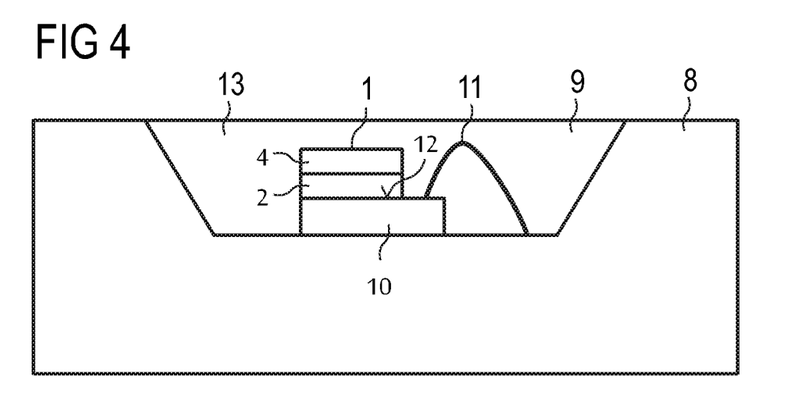
FIG. 4 shows a schematic sectional illustration of an optoelectronic semiconductor component according to one exemplary embodiment.

The optoelectronic semiconductor component according to the exemplary embodiment of FIG. 4 has a component housing 8 having a recess 9. A semiconductor body 10, which is electrically contacted on the front side via a bond wire 11, is mounted on the bottom of the component housing 8.

The semiconductor body 10 is capable of emitting electromagnetic radiation of a first wavelength range in operation, which is emitted from a radiation exit surface 12. The first wavelength range consists in the present case of blue radiation.

A ceramic conversion element 1, as was already described on the basis of FIG. 1 or FIG. 2, is applied to the radiation exit surface 12 of the semiconductor body 10. It is also possible that another conversion element 1, for example, according to FIG. 3, is arranged on the radiation exit surface 12.

The blue radiation of the first wavelength range, which is emitted from the radiation exit surface 12 of the semiconductor body 10, passes through the ceramic conversion element 1. In this case, a part of the blue radiation is converted by the first phosphor 3 of the first ceramic layer 2 into yellow or red-yellow light. The blue radiation then passes through the second ceramic layer 4 and is partially converted into green light by the second phosphor 5. The remaining part of the blue light of the semiconductor body 10 passes through the conversion element 1 unconverted. In this manner, the optoelectronic semiconductor component according to the exemplary embodiment of FIG. 4 emits mixed-color, white radiation, which comprises blue radiation of the first wavelength range, red-yellow radiation of the second wavelength range, and green radiation of the third wavelength range and has a colorimetric locus in the white range.

The recess 9 of the component housing 8 is furthermore filled in the present case with a casting 13, which encloses and protects the semiconductor body 10.

Figure 5:
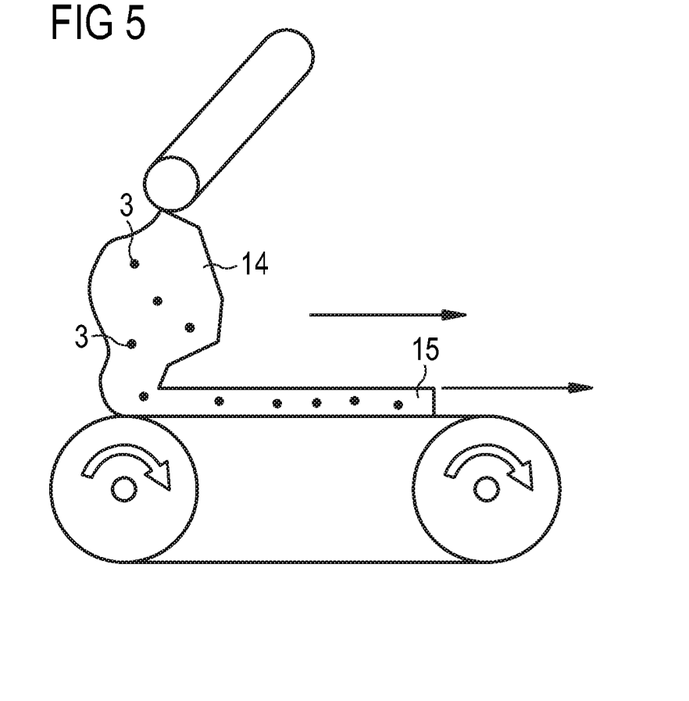

In the method according to the exemplary embodiment of FIGS. 5 to 9, in a first step, a base material 14 for a green film is produced (not shown). For this purpose, an inorganic first phosphor 3 in particle form is introduced into an organic matrix material. The base material 14 is then drawn into a green film 15 (FIG. 5). In the same manner, a further green film 16 having a second phosphor 5 is produced (not shown).

Figure 6:
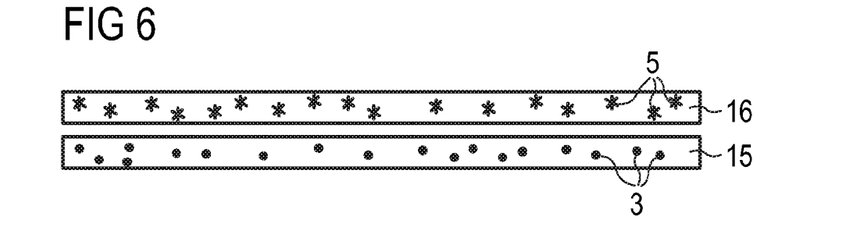

A first green film 15 and a second green film are now ready (FIG. 6). The first green film 15 has a first phosphor 3, which is capable of converting electromagnetic radiation of the first wavelength range into electromagnetic radiation of the second wavelength range. The second green film 16 comprises a second phosphor 5, which is capable of converting electromagnetic radiation of the first wavelength range into electromagnetic radiation of a third wavelength range.

Figure 7:
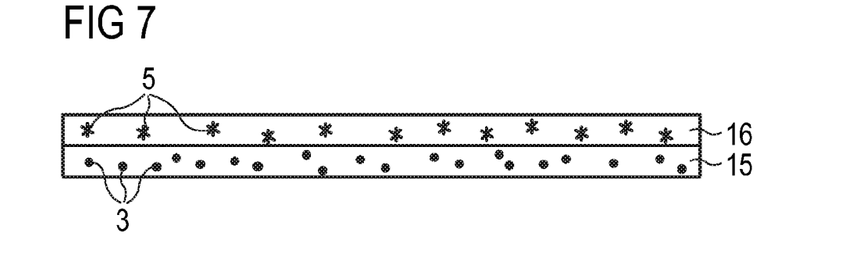
Figure 8:
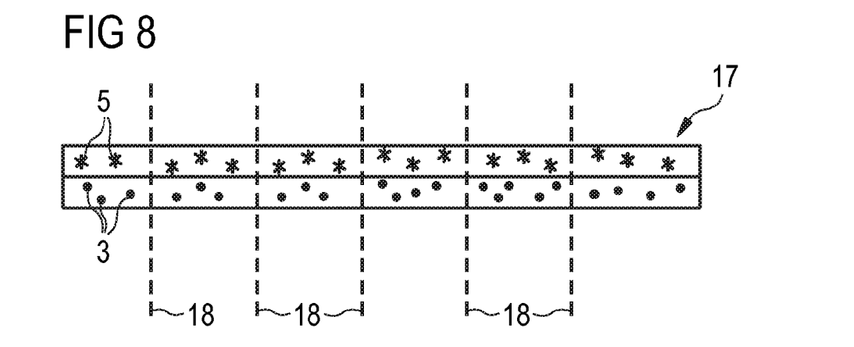
Figure 9:
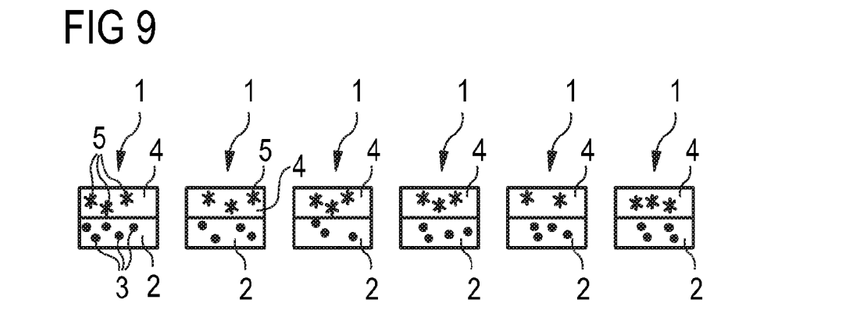

In a next step, the two green films 15, 16 are laminated onto one another (FIG. 7). The two green films 15, 16 are in direct contact with one another in this case. Finally, the layer sequence having the first green film 15 and the second green film 16 is sintered, so that a plate-shaped ceramic element 17 results.

The plate-shaped ceramic element 17 is then cut along multiple partition lines 18 into individual ceramic conversion elements 1 (FIG. 8) in a further step. A plurality of ceramic conversion elements 1 is now available (FIG. 9), as were already described on the basis of FIGS. 1 and 2, for example.

To create a ceramic conversion element 1 having three different ceramic layers 2, 4, 6, three different green films are provided, laminated with one another, and sintered similarly.

Figure 10:
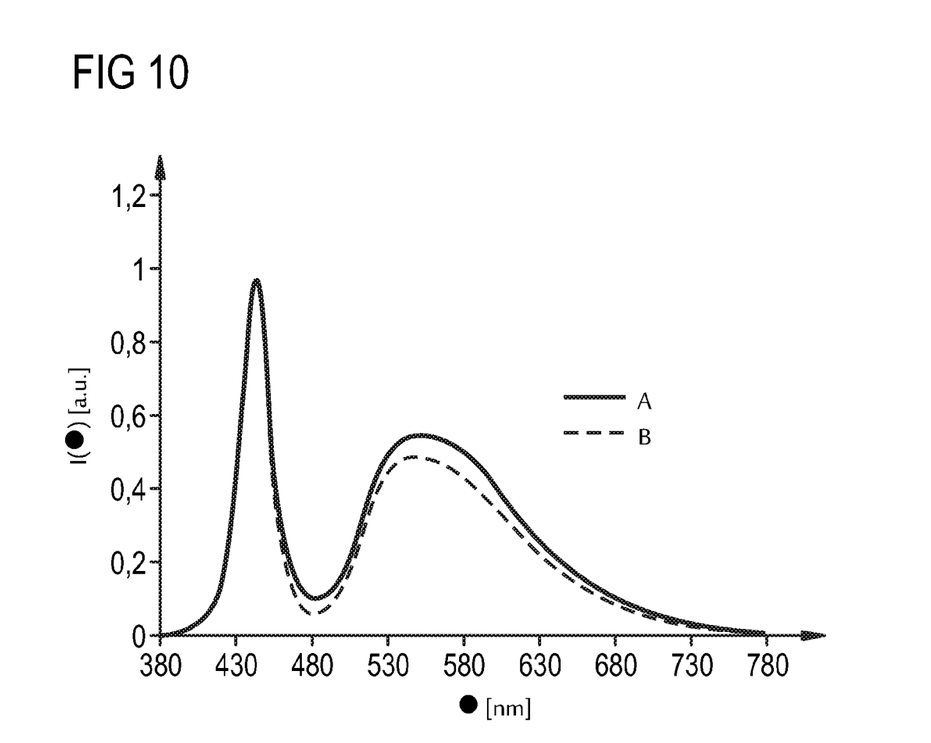
FIG. 10 schematically shows the emission spectrum of a conventional optoelectronic component (curve A) and the emission spectrum of an optoelectronic component (curve B) according to FIG. 4.

The solid curve A in FIG. 10 shows the relative intensity I as a function of the wavelength $\lambda$, which is emitted by a conventional optoelectronic semiconductor component, in which the first phosphor 3 and the second phosphor 5 are contained in particle form in the casting 13. The first phosphor 3 is $Y_3Al_5O_{12}:Ce^{3+}$ and the second phosphor 5 is $Lu_3Al_5O_{12}:Ce^{3+}$.

Furthermore, FIG. 10 shows the relative intensity I as a function of the wavelength X, which is emitted by an optoelectronic semiconductor component, which contains a conversion element 1 as was already described on the basis of FIG. 1 (curve B, dashed line). In this case, the first phosphor 3 and the second phosphor 5 are arranged positionally separated from one another in two different ceramic layers 2, 4. The first phosphor 3 is again $Y_3Al_5O_{12}:Ce^{3+}$ and the second phosphor 5 is also $Lu_3Al_5O_{12}:Ce^{3+}$. A comparison of the two curves shows that by way of the arrangement of the two phosphors 3, 5 in two separate ceramic layers 2, 4, the conversion efficiency can be improved and in addition lesser losses of radiation occur from specific wavelength ranges because of reabsorption.

The invention is not restricted thereto by the description on the basis of the exemplary embodiments. Rather, the invention comprises every novel feature and every combination of features, which includes in particular every combination of features in the patent claims, even if this feature or this combination itself is not explicitly specified in the patent claims or the exemplary embodiments.

The invention claimed is:

1. A ceramic conversion element comprising:
    a first ceramic layer, which has a first phosphor that converts electromagnetic radiation of a first wavelength range into electromagnetic radiation of a second wavelength range; and
    a second ceramic layer, which has a second phosphor that converts electromagnetic radiation of the first wavelength range into electromagnetic radiation of a third wavelength range;
    wherein the first phosphor and the second phosphor originate from the phosphor system $Ln_3(Al_5O_{12}):Ce^{3+}$, wherein Ln stands for at least one element selected from the group consisting of lutetium, yttrium, scandium, gadolinium, and terbium; and
    wherein the first wavelength range comprises blue light, the second wavelength range comprises yellow and/or red light and the third wavelength range comprises green light.

2. The ceramic conversion element according to claim 1, wherein a main extension plane of the first ceramic layer and a main extension plane of the second ceramic layer are arranged in parallel to a main surface of the ceramic conversion element.

3. The ceramic conversion element according to claim 1, wherein the first ceramic layer and the second ceramic layer implement a common interface.

4. The ceramic conversion element according to claim 1, wherein the first phosphor is selected from the group consisting of $(Gd,Y)_3Al_5O_{12}:Ce^{3+}$ and $Tb_3Al_5O_{12}:Ce^{3+}$ and wherein the second phosphor is selected from the group consisting of $Lu_3Al_5O_{12}:Ce^{3+}$ and $Sc_3Al_5O_{12}:Ce^{3+}$.

5. The ceramic conversion element according to claim 1, wherein the first ceramic layer has a thickness between 50 µm inclusive and 300 µm inclusive.

6. The ceramic conversion element according to claim 1, wherein the second ceramic layer has a thickness between 30 µm inclusive and 100 µm inclusive.

7. The ceramic conversion element according to claim 1, wherein a third ceramic layer is arranged between the first ceramic layer and the second ceramic layer, the third ceramic layer having a third phosphor that converts electromagnetic radiation of the first wavelength range into electromagnetic radiation of a fourth wavelength range and is based on at least one oxygen-containing inorganic compound.

8. An optoelectronic semiconductor component comprising:
    a semiconductor body, which emits electromagnetic radiation of a first wavelength range from a radiation exit surface during operation; and
    a ceramic conversion element according to claim 1, which converts the electromagnetic radiation from the first wavelength range at least partially into radiation from the second wavelength range and the third wavelength range, so that the optoelectronic semiconductor component emits electromagnetic radiation of the first wavelength range, the second wavelength range, and the third wavelength range during operation.

9. The optoelectronic semiconductor component according to claim 8, wherein the optoelectronic semiconductor component emits mixed-color radiation having a colorimetric locus in the white range of the CIE chromaticity diagram during operation.

10. The optoelectronic semiconductor component according to claim 8, wherein the ceramic conversion element is arranged such that the ceramic layer, the phosphor of which converts the light of the first wavelength range into light having the greatest wavelength, faces toward the radiation exit surface of the semiconductor body.

11. A method for producing a ceramic conversion element, the method comprising:
    providing a first green film having a first phosphor, which is capable of converting electromagnetic radiation of a first wavelength range into electromagnetic radiation of a second wavelength range;
    providing a second green film having a second phosphor, which is capable of converting electromagnetic radiation of the first wavelength range into electromagnetic radiation of a third wavelength range;
    laminating the first green film with the second green film; and
    sintering a layer composite having the first green film and the second green film, so that a ceramic conversion element results, the conversion element comprising:
    a first ceramic layer, which has a first phosphor that converts electromagnetic radiation of the first wavelength range into electromagnetic radiation of the second wavelength range, and
    a second ceramic layer, which has the second phosphor that converts electromagnetic radiation of the first wavelength range into electromagnetic radiation of the third wavelength range, wherein the first phosphor and the second phosphor are based on at least one oxygen-containing inorganic compound and are different from one another.

12. The method according to claim 11, wherein the sintering of the layer composite is performed in a single sintering step.

13. The method according to claim 11, wherein the first phosphor and the second phosphor originate from the phosphor system $Ln_3(Al_5O_{12}):Ce^{3+}$, wherein Ln stands for at least one element selected from the group consisting of lutetium, yttrium, scandium, gadolinium, and terbium.

14. A ceramic conversion element comprising:
    a first ceramic layer, which has a first phosphor that converts electromagnetic radiation of a first wavelength range into electromagnetic radiation of a second wavelength range; and
    a second ceramic layer, which has a second phosphor that converts electromagnetic radiation of a first wavelength range into electromagnetic radiation of a third wavelength range,
    wherein the first phosphor and the second phosphor are based on at least one oxygen-containing inorganic compound and are different from one another.

15. The ceramic conversion element according to claim 14, wherein the first phosphor and the second phosphor originate from the phosphor system $Ln_3(Al_5O_{12}):Ce^{3+}$, wherein Ln stands for at least one element selected from the group consisting of lutetium, yttrium, scandium, gadolinium, and terbium.

* * * * *